US006317859B1

(12) United States Patent
Papadopoulou

(10) Patent No.: US 6,317,859 B1
(45) Date of Patent: Nov. 13, 2001

(54) METHOD AND SYSTEM FOR DETERMINING CRITICAL AREA FOR CIRCUIT LAYOUTS

(75) Inventor: Evanthia Papadopoulou, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/329,124

(22) Filed: Jun. 9, 1999

(51) Int. Cl.[7] ............................ G06F 17/50; G06F 19/00
(52) U.S. Cl. ...................... 716/4; 716/8; 703/1; 700/110; 700/121
(58) Field of Search ................. 716/1–21; 700/108–109, 700/121; 703/1

(56) References Cited

U.S. PATENT DOCUMENTS 6,178,539 * 1/2001 Papadopoulou et al. ................ 716/7

OTHER PUBLICATIONS

Aurenhammer et al., "Voronoi Diagrams,", Chapter 18, Textbook on Computational Geometry, J. Sack and G. Urrutia (eds), to appear, pp. 3–101; Feb. 1996.

Dehne et al., "The Big Sweep: On the Power of the Wavefront Approach to Voronoi Diagrams," Algorithmica (1997) pp. 17, 19–32, Jan. 1997.

A.V. Ferris–Prabhu, "Modeling the Critical Area in Yield Forecasts", IEEE J. of Solid State Circuits, vol. SC–20, No. 4, Aug. 1985, pp. 874–878.

A.V. Ferris–Prabhu, "Defect Size Variations and Their Effect on the Critical Area of VLSI Devices," IEEE J. of Solid State Circuits, vol. SC–20, No. 4, Aug. 1985, pp. 878–880.

Gandemer et al., "Critical Area and Critical Levels Calculation in I.C. Yield Modeling," IEEE J. of Solid State Circuits, vol. 35, No. 2, Feb. 1988, pp. 158–166.

D.T. Lee, "On k–Nearest Neighbor Voronoi Diagrams in the Plane," IEEE Transactions On Computers, vol. C–31, No. 6, Jun. 1982, pp. 478–487.

W. Maly, "Modeling of Lithography Related Yield Losses for CAD of VLSI Circuits," IEEE Transactions on Computer–Aided Design, vol. CAD–4, No. 3 pp. 166–177, Jul. 1985.

(List continued on next page.)

Primary Examiner—Matthew Smith
Assistant Examiner—Phallaka Kik
(74) Attorney, Agent, or Firm—F. Chau & Associates, LLP

(57) ABSTRACT

A method for computing critical area for opens of a layout, which may be implemented by program storage device readable by machine, tangibly embodying a program of instructions executable by the machine, to perform the method steps includes computing Voronoi diagrams of shapes of the layout, determining core elements and weights for the core elements of the shapes, computing a weighted Voronoi diagram for the layout to arrive at a partitioning of the layout into regions, computing critical area within each region and summing the critical areas to arrive at a total critical area for opens in the layout.

39 Claims, 9 Drawing Sheets

OTHER PUBLICATIONS

Maly et al., "Yield Estimation Model for VLSI Artwork Evaluation," Electron Lett., vol. 19, No. 6, pp. 226–227, Mar. 1983.

Papadopoulou et al, "L∞ Voronoi Diagrams and Applications to VLSI Layout and Manufacturing," Manuscript, Extended Abstract submitted to International Symposium on Algorithms and Computation, 1998. (To appear in proceedings of ISAAC98, Dec. 1998), pp. 1–10.

Pineda et al., "IC Defect Sensitivity for Footprint–Type Spot Defects," IEEE Trans. on Computer–Aided Design, vol. 11, No. 5, pp. 638–658, May 1992.

Wagner et al., "An Interactive VLSI CAD Tool for Yield Estimation," IEEE Trans. On Semiconductor Manufacturing, vol. 8, No. 2, 1995, pp. 130–138, May 1995.

Walker et al., "VLASIC: A Catastrophic Fault Yield Simulator for Integrated Circuits," IEEE Trans. on Computer–Aided Design, vol. CAD–5, No. 4, pp. 541–556, Oct. 1986.

D.M. H. Walker, "Critical Area Analysis," Journal Preprint, Carnegie Mellon University, SRC Pub. C91611, Aug. 1991, pp. 1–10.

Pleskacz et al, "A DRC–Based Algorithm for Extraction of Critical Areas for Opens in Large VLSI Circuits," IEEE Transactions on Computer–Aided Design of Integrated Circuits and Systems, vol. 18, No. 2, Feb. 1999, pp. 151–162.

Rogenski, "Extraction of Breaks in Rectilinear Layouts by Plane Sweeps," UCSC–CRL–94–21, Apr. 1995, pp. 1–30.

Papadopoulou et al., "Critical Area Computation via Voronoi Digrams," IEEE Transactions on Computer–Aided Design of Integrated Circuits and Systems, vol. 18, No. 4, Apr. 1999; pp. 463–474.

B.R. Mondava, "Critical Areas for Yield Models," Technical Report, IBM General Technology Division, Jan. 1982, pp. 1–29.

* cited by examiner

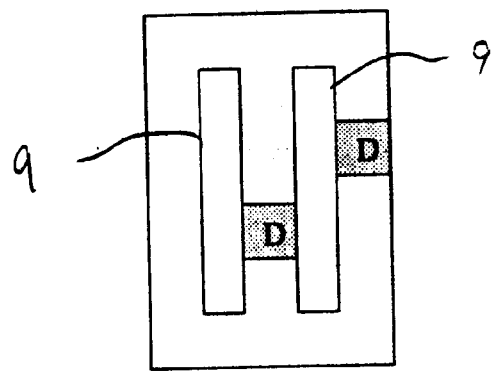
FIG. 3
redundant vias          unified contacts
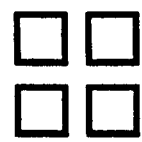   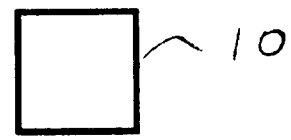
   
FIG. 4A         FIG. 4B
(Prior Art)

FIG. 6A 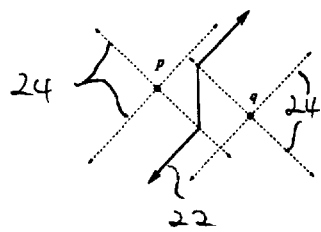 FIG. 6B 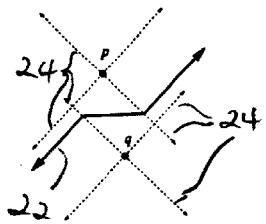
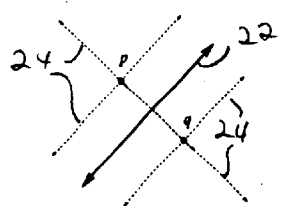 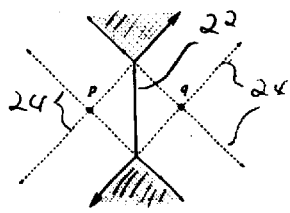
FIG. 6C FIG. 6D
FIG. 7A 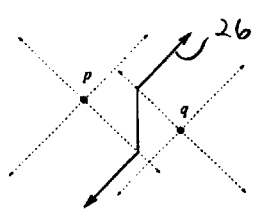 FIG. 7B 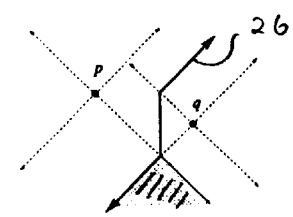 FIG. 7C 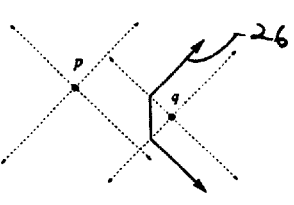
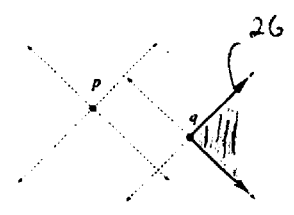 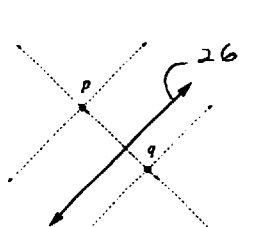 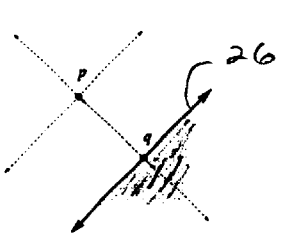
FIG. 7D FIG. 7E FIG. 7F

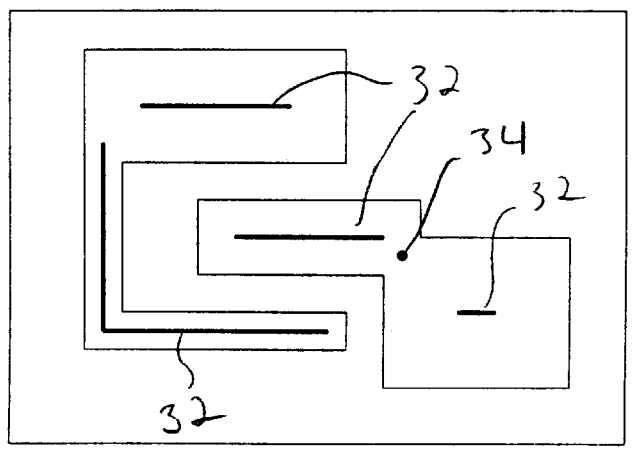
FIG. 10
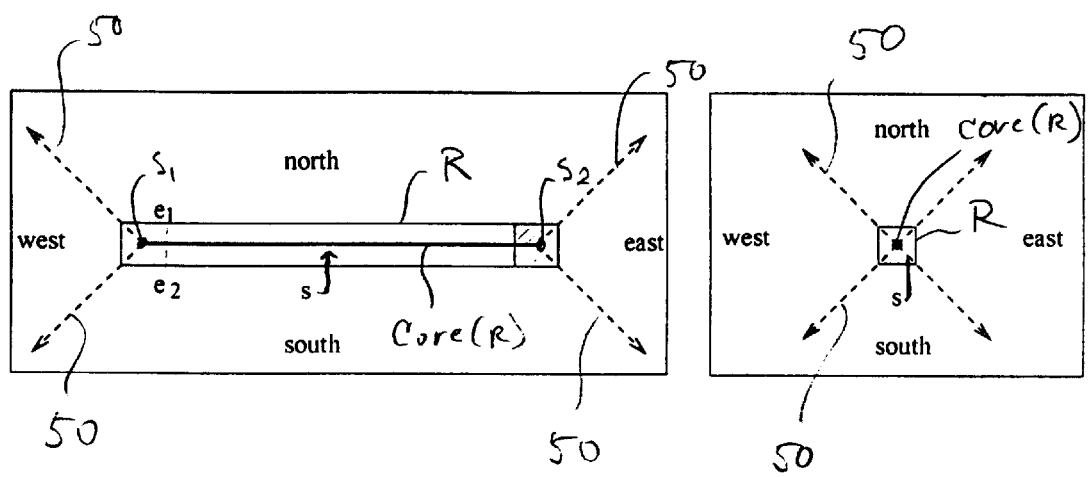
FIG. 11A
FIG. 11B

METHOD AND SYSTEM FOR DETERMINING CRITICAL AREA FOR CIRCUIT LAYOUTS

BACKGROUND OF THE INVENTION

1. Field of the Invention

The present invention relates to determination of critical area and, more particularly, to a method and system for computing critical areas for predicting yield for semiconductor devices.

2. Description of the Related Art

Critical area of a very large scale integration (VLSI) layout is a measure that reflects the sensitivity of the layout to defects occurring during the manufacturing process. Critical area is widely used to predict the yield of a VLSI chip. Yield prediction is essential in today's VLSI manufacturing due to the growing need to control cost. Models for yield estimation are based on the concept of critical area which represents the main computational problem in the analysis of yield loss due to spot defects during fabrication. Spot defects are caused by particles such as dust and other contaminants in materials and equipment and are classified into two types: "extra material" defects causing shorts between different conducting regions and "missing material" defects causing open circuits.

Extra material defects appear most frequently in a typical manufacturing process and are the main reason for yield loss. The yield of a chip, denoted by Y, is computed as $$Y = \prod_{i=1}^{m} Y_i$$

where Yi is the yield associated with the ith step of the manufacturing process. The yield of a single processing step is modeled as $$Y_i = \left(1 + \frac{dA_c}{\alpha}\right)^{-\alpha}$$

where d denotes the average number of defects per unit of area, $\alpha$ the clustering parameter, and $A_c$, the critical area. Extra material defects has been addressed in detail in a related commonly assigned disclosure, application Ser. No. 09/156,069 now U.S. Pat. No. 6,178,539 B1, incorporated herein by reference for all purposes.

For a circuit layout C, the critical area is defined as $$A_c = \int_0^\infty A(r)D(r)\,dr$$

where A(r) denotes the area in which the center of a defect of radius r must fall in order to cause circuit failure and D(r) is the density function of the defect size. The defect density function has been estimated as follows:

$$D(r) = \begin{cases} \dfrac{cr^q}{r_0^{q+1}}, & 0 \le r \le r_0 \\ \dfrac{cr_0^{p-1}}{r^p}, & r_0 \le r \le \infty \end{cases} \quad \text{(EQ. 1)}$$

where p, q are real numbers (typically p=3, q=1), c=(q+1)(p−1)/(q+p), and $r_0$ is some minimum optically resolvable size.

Using typical values for p, q and c we derive the widely used defect size distribution $D(r)=r^2_0/r^3$. Since $r_0$ is typically smaller than the minimum feature size, D(r) is ignored for $r<r_0$).

Missing material defects cause open circuits by breaking intended connections. For example, on a metal interconnect layer an open is created by a defect breaking the continuity of an interconnection or a contact plug; on a via or contact layer an open is a defect destroying a contact. Thus, two types of missing material defects can be distinguished: breaks, interfering with the continuity of an interconnect, and via-blocks, destroying contacts on via layers. Critical area may be computed independently for each type of defect.

Existing methods of extracting critical area for opens can be summarized as follows:

1. Monte Carlo simulation: Draw a large number of defects with their radii distributed according to D(r), check for each defect if it causes an open circuit, divide the number of defects causing faults by the total number of defects to derive the probability of fault.

2. Geometric methods: Compute the area of critical region A(r) for several different values of r independently; use the results to approximate the total critical area. Opens are treated geometrically without considering actual breaks of connectivity. These methods are usually based on shape manipulation tools providing operations such as shrink-shape-by-r and find-area techniques. The time complexity for each defect radius depends on the underlying shape manipulation algorithms. A(r) may also be computed using a more efficient scan-line method.

3. The grid method of one prior art technique assumes a fine grid over the layout and computes the critical radius (The critical radius at point t is the radius of the smallest defect centered at t causing an open) for every grid point. The method is given for shorts; opens are treated as the dual problem. The run-time is $O(I^{1.5})$ time, where I is the number of grid points. A more thorough analysis to critical area for missing materials is given by J. S. Rogenski in "Extraction of Breaks in Rectilinear Layouts by Plane Sweeps," Technical Report, Univ. of California, Santa Cruz, UCSC-CRL-94–21, April 1995.

4. A(r) for a given defect radius r, may also be calculated strictly over each shape (critical regions expanding in the free space are ignored). The critical region in one shape is assumed to be produced by broken edges on the same shape. The algorithm uses plane sweep and builds connectivity graphs for each node. This method (unlike the geometric ones) considers actual breaks of connectivity and runs in $O(n^2 \log n)$ time.

The prior art methods described above require high computation times, and even then do not accurately compute critical area. The existing geometric methods compute the area of the critical region for only one defect size and require higher time complexity.

The above approaches suffer from accuracy and complexity problems as described. Therefore, a need exists for an improved approach for computing the critical area for opens in a single layer of a semiconductor device. A further need exists for a low polynomial algorithm for computing critical area for opens with improved accuracy and reduced complexity.

SUMMARY OF THE INVENTION

A method for computing critical area for opens of a layout, which may be implemented by a program storage device readable by machine, tangibly embodying a program of instructions executable by the machine, to perform the method steps includes computing Voronoi diagrams of shapes of the layout, determining core elements and weights for the core elements of the shapes, computing a weighted Voronoi diagram for the layout to arrive at a partitioning of the layout into regions, computing critical area within each region and summing the critical areas to arrive at a total critical area for opens in the layout. The step of identifying areas prone to opens in the layout based on the critical area may be included.

A method for predicting yield based on critical area for opens of a layout of a circuit, includes the steps of computing a Voronoi diagram based on a core of elements of the layout, computing a weighted Voronoi diagram for orthogonal segments of the core of elements to arrive at a partitioning of the layout into regions, computing critical area within each region, summing the critical areas to arrive at a total critical area for opens in the layout, predicting a sensitivity to defects of the layout based on the total critical area, and modifying the layout according to the sensitivity.

In alternate methods which may be implemented by a program storage device, the step of computing critical area may include the step of computing the critical area according to the following equation:

$$A_c = \int_0^\infty A(r)D(r)\,dr,$$

where $A_c$ is the critical area, $A(r)$ is the area of the critical region for defects of radius r and $D(r)$ is a defect density function. The defect density function may include the defect size distribution $D(r)=r_0^2/r^3$ where r denotes spot defect radius and $r_0$ denotes a constant size. The Voronoi diagram preferably includes Voronoi edges associated with shapes of the layout and the steps of classifying the Voronoi edges to identify between areas that contribute to the critical area and areas that subtract from the critical area may be included. The shapes may include locations for circuit components. The Voronoi diagram and the weighted Voronoi diagram may include an $L_\infty$ distance metric. The step of computing the Voronoi diagram may include the step of computing the Voronoi diagram using a sweep line algorithm. The shapes of the layout may be adjusted based on the critical area calculation.

The step of weighting the Voronoi diagram may include the step of computing the Voronoi diagram using a sweep line algorithm. The step of adapting computations of areas for the regions of the layout associated with shapes in the layout having edges with any slope may be included. The step of summing the critical areas may include the steps of adding amounts derived from Voronoi edges that contribute to the total critical areas, and subtracting amounts derived from Voronoi edges that reduce the total critical area. The opens may include breaks or blocks, such as via blocks. The opens may include partial opens and the steps of providing a partial critical area for computing the critical area of a partial open by multiplying neighboring core elements by a fraction to represent a critical radius of the partial open may be included.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein:

FIG. 3 illustrates a minimal break configurations for a complex shape;

FIG. 4A illustrates redundant via configurations in accordance with the prior art;

FIG. 4B illustrate unified contact configurations in accordance with the present invention;

FIGS. 6A–6D illustrate $L_\infty$ bisectors between two points;

FIGS. 7A–7D illustrate $L_\infty$ bisectors between two additively weighted points where the weight is progressively more biased toward point q in accordance with the present invention;

FIGS. 7E–7F illustrate $L_\infty$ bisectors between two points aligned along a 45° line where the weight is progressively more biased toward point q in accordance with the present invention;

FIG. 10 illustrates a core for simple shapes as determined in accordance with the present invention;

FIG. 11A illustrates a polygon with a core segment s and 45° rays emanating from endpoints $s_1$ and $s_2$ for partitioning a plane into four quadrants for determining critical radius in accordance with the present invention;

FIG. 11B illustrates a case where the polygon is a square and s is a disjoint point in accordance with the present invention;

FIG. 16 is a block/flow diagram for method and system for determining critical area for circuit layouts.

DETAILED DESCRIPTION OF PREFERRED EMBODIMENTS

Figure 1A:
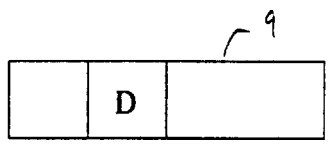
FIGS. 1A–1E illustrate minimal break configurations for a defect D for determining critical area in accordance with the present invention.

The invention includes methods for computing the critical area for opens in a circuit layout. The critical area calculation is one important computational problem in VLSI yield prediction. The method of the present invention is based on the concept of Voronoi diagrams and computes the critical area for opens (for all possible defects) accurately in O(n log n) time, where n is the size of the input. The method is presented for rectilinear layouts but it is extendible to general layouts.

A circuit failure for the following disclosure will represent an open circuit. Defects of size r are preferably modeled as a square of side 2r (i.e., square of radius r). Modeling defects as squares corresponds to computing critical area in the $L_\infty$ metric (The $L_\infty$ distance between two points $p=(x_p,y_p)$ and $q=(x_q, y_q)$ is the maximum of the horizontal and the vertical distance p and q, i.e., $d(p,q)=\max\{|x_p-x_q|, |y_p-y_q|\}$) instead of the Euclidean geometry. In reality, spot defects have any kind of shape; thus, the square defect model is good for all practical purposes. Critical area in the $L_\infty$ metric is always an upper bound to the Euclidean critical area.

In accordance with the present invention, a geometric modeling of breaks and via-blocks is employed, and the problem of computing critical area for breaks and via-blocks into variations of (weighted) $L_\infty$ Voronoi diagrams is performed. Once the Voronoi diagrams are computed the total critical area for opens can be computed analytically as a function of Voronoi edges (see, e.g., application Ser. No. 09/156,069 now U.S. Pat. No. 6,178,539 B1, previously incorporated by reference). The reduction of the critical area computation problem to Voronoi diagrams results in a O(n log n) time algorithm to compute critical area. This is the first low polynomial algorithm to compute critical area accurately (according to the geometric definition of breaks and via-blocks) in irregular layouts.

Note that existing geometric methods compute the area of the critical region for only one defect size and require higher time complexity. A limitation to the geometric modeling of breaks is that, by ignoring the actual connections, critical area may be overestimated in case of interconnect shapes that contain redundant or non-conducting regions. However, this limitation is reasonable (as will be explained) and allows for fast extraction of critical area. As mentioned, the method of the present invention is presented for rectilinear layouts but it is extendible to general layouts.

Geometric Modeling of Breaks and Via Blocks

Considering a layer where missing material defects break the continuity of interconnections and contact plugs, a simple shape corresponds to a simple polygon and includes no holes. A shape with hole(s) is called complex.

For a simple shape, a defect D is a minimal break, if D breaks the shape into two or more pieces, and D has minimal size, i.e., if D is shrunk by $\epsilon \geq 0$ where $\epsilon$ is a positive number arbitrarily small, and to shrink by $\epsilon$ means to move the edges of D towards the interior of D by a distance $\epsilon$. Then, D will be entirely contained in the interior of the shape without breaking it. A piece of a shape may include a single edge.

Referring to FIG. 1A–1E, examples of defects D considered to be minimal breaks are shown for shapes 9. Shapes 9 may include metallizations or other conductive components of a circuit. A break is any defect D totally covering a minimal break. For a complex shape, a break is also any defect overlapping the outer and inner boundary of the shape or a defect overlapping any two distinct inner boundaries. See, e.g., FIG. 3 where a break D is shown for a complex shape.

Figure 1B:
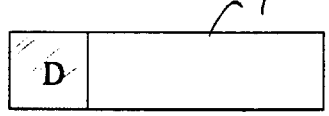
Figure 1C:
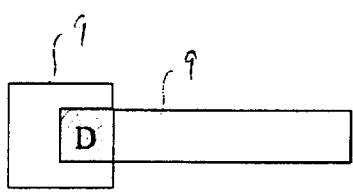
Figure 1D:
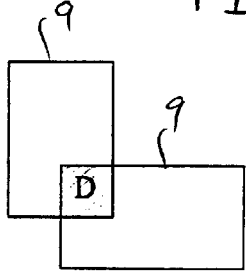
Figure 1E:
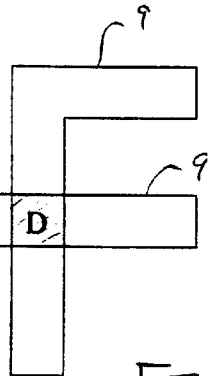
Figure 2A:
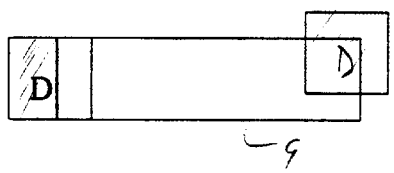
FIGS. 2A–2B illustrate configurations without a break for a defect D.
Figure 2B:
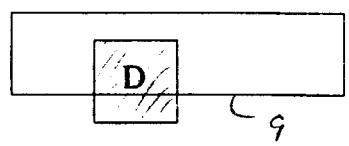

Referring to FIGS. 2A–2B, examples of defects that are not considered to be breaks are shown. Note the difference between D in FIGS. 1B and 2A and 2B. In FIG. 1B, D is a minimal break where one piece is trivially a single edge, i.e., edge 8. If D is moved slightly to the left then D will not be a break. The reason for this distinction is the assumption that the ending of a shape includes some contact (via or similar structure) which is completely destroyed when D falls over it.

As mentioned above, the geometric definition for a break may include some reasonable aspects. A break is a defect that breaks an intended connection or destroys the contact itself. By looking only at the geometry of a shape without considering its connectivity, it may be overestimating critical area in some cases. For example, a shape may include a redundant region whose removal would not affect conductivity. A defect falling over such a redundant region does not harm the circuit and ideally should not be contributing to critical area. These redundant regions may be ignored for two reasons. First, it is reasonable to assume that there must have been a good reason for the existence of a redundant region in a shape and thus it is fair to consider defects that destroy such redundant regions as faults. Second, the problem of identifying redundant regions could be treated separately from critical area calculations. If an algorithm identifying redundant regions of shapes is provided, those regions could be removed from the shape prior to critical area calculations. In accordance with the present invention, any defect satisfying the above break definition may be assumed to cause a fault.

Now considering a via or contact layer, vias between layers are typically realized by square shapes. To reduce the probability of missing contacts or to achieve a desired resistance, designers often use redundant vias, a group of multiple vias that connect two shapes on different layers. Redundant vias are usually grouped together side by side and thus, they can be regarded as a single via of larger size.

Referring to FIGS. 4A and 4B, a group of redundant contacts are shown for a given layout as designed in FIG. 4A. FIG. 4B shows unified contacts 10 and 12 which represent a larger area for a single contact in accordance with the present invention. Because of redundant vias, contacts can not be assumed to be squares but rectilinear shapes (often rectangles) of any size. A via-block or block is a defect that completely destroys a contact i.e., a defect that completely covers a whole via or a group of redundant vias.

Identifying redundant vias at a via layer is a separate task from critical area calculation. For this disclosure, it is assumed for simplicity that redundant vias have been identified in a preprocessing step and have been grouped together into atomic rectilinear shapes referred to as contacts. Existing shape processing tools, known to those skilled in the art, can perform this type of operation.

It is easy to see that a square defect completely covers a rectilinear shape if and only if it totally covers its minimum enclosing rectangle. Hence, it is further assumed that contacts are represented by their minimum enclosing rectangle. As a result, a via layer can be preprocessed into a collection of disjoint rectangles of various sizes. A via-block is a defect that totally covers such a rectangle.

$L_\infty$ Voronoi Diagrams

The Voronoi diagram of a set of polygonal sites is a partitioning of the plane into regions, called Voronoi cells, such that the Voronoi cell of a site s is the locus of points closer to s than to any other site. The Voronoi cell of s is denoted as reg(s) and s is referred to as the owner of reg(s). The boundary that borders two Voronoi cells is called a Voronoi edge, and includes portions of bisectors between the owners of the cells. The point where three or more Voronoi edges meet is called a Voronoi vertex. In the interior of a simple polygon P, the Voronoi diagram is also called a medial axis. Formally, the medial axis is the locus of points {q} internal to P such that there are at least two points on the object's boundary that are equidistant from {q} and are closest to {q}.

Figure 5:
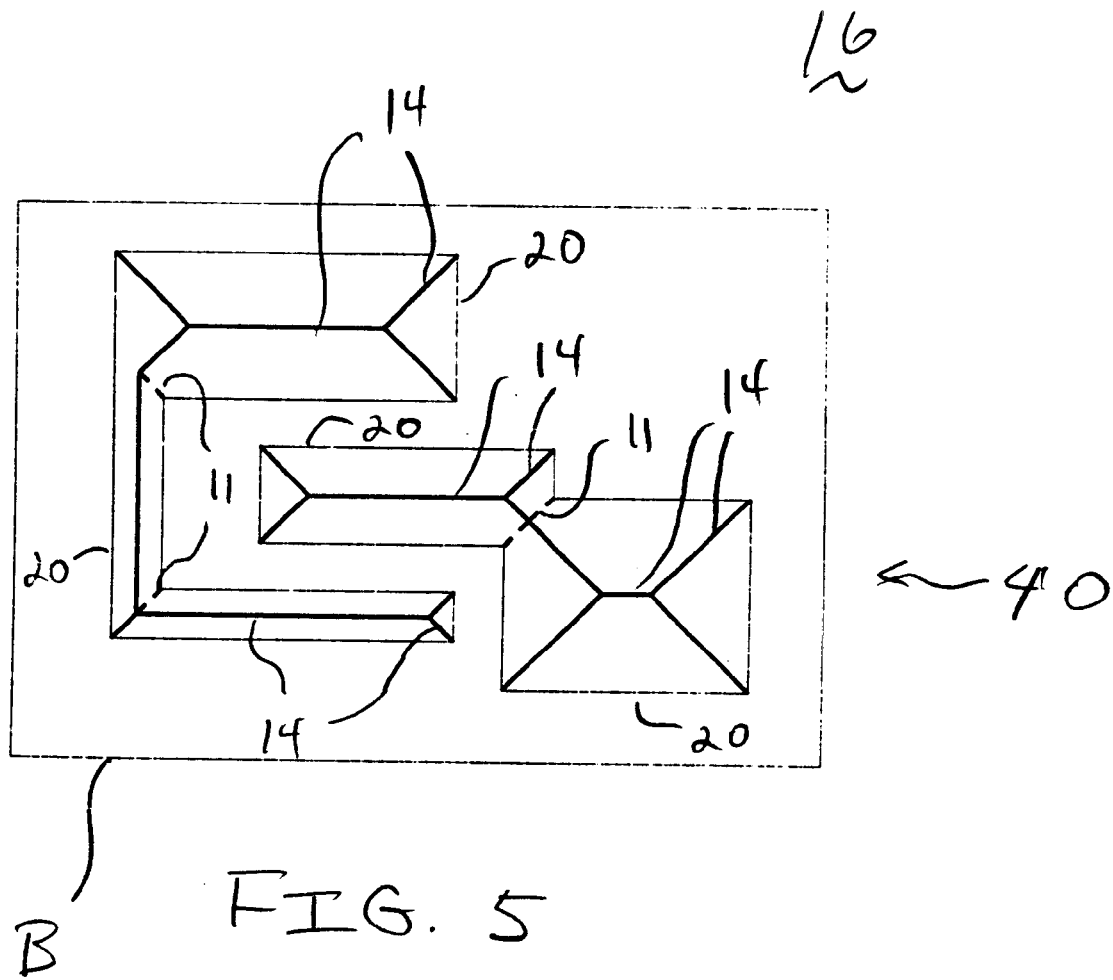
FIG. 5 illustrates a medial axis of polygons in a $L_\infty$ metric in accordance with the present invention.

Referring to FIG. 5, a medial axes of rectilinear shapes in the $L_\infty$ metric is shown. Dashed segments 14 are part of the Voronoi diagram 16 but are not part of the medial axis. This distinction is of no importance and is ignored. Thicker lines 14 (core segments) are part of the medial axis for shapes 20 shown. The use of the $L_\infty$ metric simplifies the Voronoi diagram of polygonal objects and makes it simpler to compute. The $L_\infty$ Voronoi diagrams are a "skeleton" of straight line segments having linear combinational complexity.

The $L_\infty$ distance between two points $p=(x_p,y_p)$ and $q=(x_q,y_q)$ is the maximum of the horizontal and the vertical distance between p and q, i.e., $d(p,q)=\max\{|x_p-x_q|,|y_p-y_q|\}$. Intuitively, the $L_\infty$ distance between p and q is the size of the smallest square touching p and q. The $L_\infty$ distance between a point p and a line l is $d(p,l)=\min\{d(p,q),\forall q \in L\}$. The $L_\infty$ bisector of two polygonal elements (points or lines) is the locus of points at equal $L_\infty$ distance from the two elements.

Referring to FIGS. 6A–6D, a $L_\infty$ bisector 22 of two points p and q is illustrated for several cases. 45° rays 24, i.e., rays of slope +1 or −1, emanating from a point p, partition the plane into four quadrants such that for any point q within a quadrant, the $L_\infty$ distance simplifies to the vertical (north and south quadrant) or to the horizontal (east and west quadrant) distance between p and q. For more information see E. Papadopoulou and D. T. Lee, "Critical Area Computation via Voronoi Diagrams", IEEE Trans. On Computer-Aided Design, vol. 18, no. 4, April 1999, incorporated herein by reference and application Ser. No. 09/156,069.

Assuming that points p and q are weighted with additive weights $w_p$ and $w_q$ respectively such that $0 \leq w_p \leq w_q + d(p,q)$ (where $d(p,q)$ is a distance between p and q). The (weighted) $L_\infty$ bisector of p,q (b(p,q)) is the locus of points equidistant from p and q in a weighted sense i.e., $b(p,q)=\{t|d(t,p)+w_p=d(t,q)+w_q\}$. That is, weighting may be determined by the distance between a core segment and a boundary (edge) of the shape or polygon to which it belongs. Note that if $w_q=w_p+d(p,q)$ then the area enclosed by the 45° lines (shaded areas of FIGS. 6D, 7B, 7D and 7F) through q is equidistant from both points (p and q).

Referring to FIGS. 7A–7D, $L_\infty$ bisectors 26 of additively weighted points as $w_q$ increases ($w_p<w_q$) are shown. $w_q$ increases from FIG. 7A to FIG. 7D such that $0 \leq w_p \leq w_q + d(p,q)$. Similarly, for FIGS. 7E–7F, points p and q are aligned along a same 45° line and $w_q$ increases from FIG. 7E to FIG. 7F. Without creating any significant difference, when a whole region is equidistant from both points (shaded regions in FIGS. 7B, 7D and 7F) the region is assigned to one of the points and only the outermost boundary of the bisecting region as the bisector is considered. Bisectors 26 are depicted in thick lines.

Figure 8:
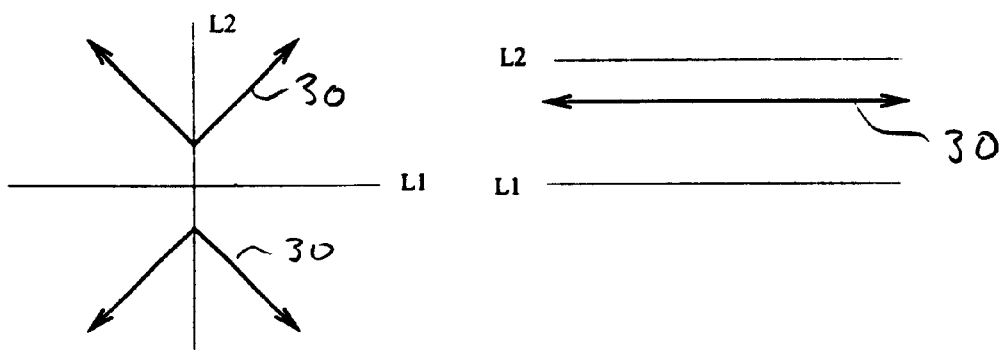
FIG. 8 illustrates $L_\infty$ bisectors between two additively weighted orthogonal lines where the weight is biased toward line $L_2$ in accordance with the present invention.

FIG. 8 illustrates a bisector 30 of two additively weighted orthogonal lines where $w(L_1)<w(L_2)$.

Computing Critical Area for Breaks

Figure 9:
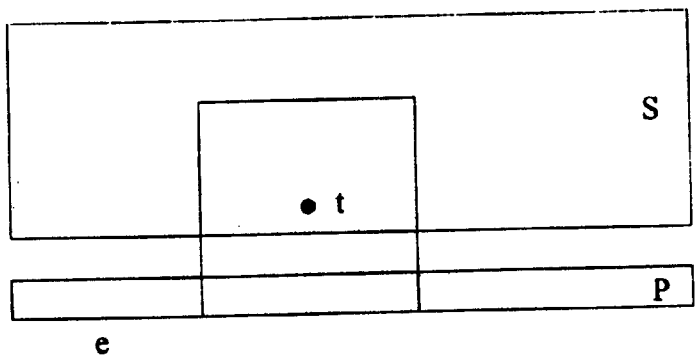
FIG. 9 illustrates a critical radius of t as determined by edge e in accordance with the present invention.

Referring to FIGS. 5 and 9, a layer 40 (FIG. 5) in a circuit layout, such as a metallization layer, includes a collection of rectilinear polygons C (labeled 20). Assuming that overlapping polygons have been unified into single shapes and thus all polygons are disjoint, a boundary of the layout is assumed to be a rectangle B. One goal is to compute the critical area for breaks i.e., to evaluate the integral $A_c = \int A(r)D(r)dr$ from 0 to infinity. We shall use the widely used defect size distribution $D(r)=r^2_0/r^3$ although other defect size distribution may be employed. Recall that A(r) denotes the area of the critical region for square defects of radius r. The critical region for a defect D of radius r is the locus of points where if the center of D is placed it causes a break. The critical radius of a point t (FIG. 9) is the radius of the smallest defect centered at t causing a break. The defect inducing the critical radius of t is called the critical defect for t. Note that the critical radius of a point over a shape S need not be determined by defects breaking edges of the same shape. In FIG. 9, the critical radius of $t \in S$ is determined by edge e in P.

Let P be a rectilinear shape (simple or complex) on layer 40 for which a computation critical area for breaks is desired. Consider a Voronoi diagram (medial axis) in the interior of P (See e.g., FIG. 5). By the definition of medial axis it can be seen that any minimal break is centered along the medial axis of P. Let the Voronoi vertices and the orthogonal Voronoi edges form a set of elements called the core of P, denoted as core(P). In FIG. 10, core(P) is shown thickened as lines 32 and point 34. A disjoint point (Voronoi vertex) 34 included in the core is simply treated as an orthogonal segment with coincident endpoints. Disjoint points appear in a core because of square-like subshapes (see FIGS. 5 and 10). Each element s in core(P) is defined by a pair of edges inducing breaks for P and is weighted with $w(s)>0$, i.e., the distance of s from the defining edges of P (the owners of s). A defect of radius w(s) centered along $s \in core(P)$ is said to be generated by s. As the following property (property 1) shows, the core of P generates all strictly minimal breaks of P. A break is called strictly minimal if it does not contain any other minimal break in its interior. Essentially, the core is a generator of breaks for shape P.

Property 1: Any strictly minimal break D is centered at an element s of core(P) and has a radius w(s).

It is to be understood that weighting for Voronoi diagrams may taken as a distance from a core segment (core(P)) of the polygon P and a boundary (edge) of the polygon. However, weights may be applied to influence the determination for opens based on other electrical or physical characteristics of the circuit or device being designed or tested. For example, a weighting for a metal line of width F and horizontally disposed may have a weight of ½ F (distance between and edge and a core segment (medial axis). This weighting may also be influenced by physical characteristics, such as conductivity or geometry to arrive at a weighting of other than ½ F.

Referring to FIGS. 11A and 11B, a single rectangle R is considered. The core of R includes a single segment s. Assuming that s is horizontal, let $s_1,s_2$ denote the east and west endpoints of s respectively. Let $e_1,e_2$ denote the north and south edges of R respectively; $w(s)=d(s,e_1)=d(s,e_2)$. In the case where R is a square, the core s is a disjoint point (FIG. 11B). Consider the four 45° rays 50 emanating from the endpoints of s (i.e., $s_1$ and $s_2$). Rays 50 partition the plane into four quadrants where the critical radius in each is easy to compute. For any point t in the north (respectively, south) quadrant of s, the critical radius of t is the vertical distance to edge $e_2$ (respectively, $e_1$) i.e., $r_c(t)=d(t,e_2)=d(t,s)+w(s)$. For a point t in the east (respectively, west) quadrant of s the critical break has to overlap with the minimal break centered at $s_1$ (respectively, $s_2$). Thus, the critical radius at t is the horizontal distance from t to $s_1$ (resp. $s_2$) plus the radius of the minimal break at $s_1$ (resp. $s_2$) i.e., $r_c(t)=d(t,s_1)+w(s_1)$ (resp. $r_c(t)=d(t,s_2)+w(s_2)$). In any case, $r_c(t)=d(t,s)+w(s)$. Therefore (assuming a single rectangle R), the critical radius at any point t is the weighted $L_\infty$ distance of t to s. The endpoints $s_1,s_2$ are treated as different elements from the open segment S. The north and south quadrant belong to s while the east and west quadrants belong to $s_1$ and $s_2$ respectively ($w(s_1)=w(s_2)=w(s)$).

Figure 12:
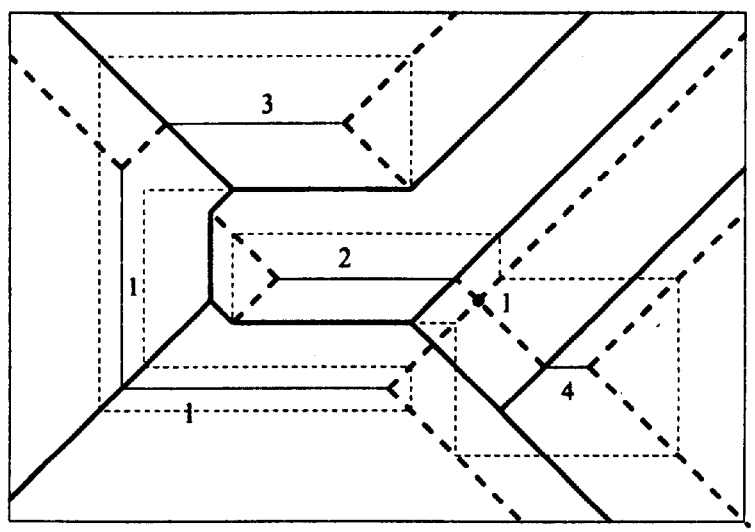
FIG. 12 illustrates a weighted Voronoi diagram for all core elements in accordance with the present invention.

Referring to FIG. 12, a weighted $L_\infty$ Voronoi diagram of a set of core elements (segments) where the numbers (from 1–4) indicate weights is shown. Assuming more than one core element, to determine the critical radius of an arbitrary point t, the (weighted) nearest core element to t should be known. This information can be derived by the weighted $L_\infty$ Voronoi diagram of the core elements as shown. Let $G=\cup_p\text{core}(P)$, $P\in C$, be the union of the core elements of all polygons on the given layer. Then, the weighted $L_\infty$ Voronoi diagram of $G$,$v(G)$, provides a partitioning of the plane into regions where the critical radius within each region is easy to derive. By the above discussion, the following property is obtained.

Property 2: The critical radius for breaks of any point t in the Voronoi cell of a core element s, s∈G, is $r_c(t)=d(t,s)+w(s)$.

The Voronoi cell of a core element is partitioned into subregions by the 45° rays (dashed lines) emanating from its endpoints. Those subregions are part of the Voronoi diagram. As a result of this finer subdivision, each open segment owns two Voronoi cells: one in its north and one in its south quadrant. The endpoints of a segment are considered to have their own Voronoi cells. Core segments are treated as part of the Voronoi diagram and their weight is treated as their critical radius. The critical radius of an orthogonal Voronoi edge e bounding the Voronoi cell of s is $r_c(e)=d(e,s)+w(s)$. The minimum and the maximum critical radius of a 45° Voronoi edge is the critical radius of its endpoints. Given $v(G)$, the critical area integral can be discretized as a summation of Voronoi edges similarly to critical area for shorts as described in application Ser. No. 09/156,069.

For the discretization of the critical area integral, Voronoi edges are colored or labeled red and blue for convenience. Red edges have a positive contribution to critical area while blue edges have a negative contribution. The classification of an edge as red or blue is done using the same criteria as in application Ser. No. 09/156,069. Here the classification can be summarized as follows: all core segments are colored red. A 45° ray emanating from an endpoint of a core element s is called converging if it forms an acute angle with the segment; otherwise it is called diverging. Given the Voronoi cell of a core element the incident diverging 45° Voronoi edges are colored red; the remaining Voronoi edges are colored blue. Boundary edges parallel to the owner are colored blue. Note that there may be 45° Voronoi edges that get different coloring with respect to the two adjacent cells. The contribution of these edges to critical areas gets canceled and thus they are colored neutral and treated as not contributing to critical area. The result is as follows:

Result 1: Given the (weighted) $L_\infty$ Voronoi diagram of all core elements of shapes in a layer C of a circuit layout, and assuming that defects are squares following the "$r_0^2/r^3$" defect density distribution, the critical area for breaks in that layer is given by the following formula:

$$A_c = r_0^2 \left( \sum_{red,e} \frac{l}{r_c} - \sum_{blue,e} \frac{l}{r_c} + \right.$$ EQ. 1

$$\left. \sum_{red,e_{45}} \ln\left(\frac{r_{max}}{r_{min}}\right) - \sum_{blue,e_{45}} \ln\left(\frac{r_{max}}{r_{min}}\right) - \frac{1}{2}\sum_{blue,b_i} \frac{l_b}{r_b} \right)$$

where l and $r_c$ denote the length and the critical radius of an orthogonal Voronoi edge, $r_{max}$, $r_{min}$ denote the maximum and the minimum critical radius of a 45° Voronoi edge, and $l_b$, $r_b$ denote the length and the critical radius of a boundary edge. The first two summations are taken over all red and all blue orthogonal Voronoi edges respectively. The third and fourth summations are taken over all red and all blue 45° Voronoi edges respectively. The last summation is taken over all blue boundary edges, $b_i$.

Critical Area for Via-Blocks

For a via or contact layer, critical area for via-blocks will now be considered. As discussed above, a via layer is assumed to have been preprocessed into a collection of rectangles of various sizes. One goal of the present invention is to compute the critical area for blocks i.e., to evaluate the integral $$A_c = \int_0^\infty A(r)D(r)dr,$$

where $A(r)$ denotes the area of the critical region for square defects of radius r causing via-blocks, and $D(r)=r^2_0/r^3$. The critical radius of a point t is the radius of the smallest defect centered at t causing a block.

Figure 13A:
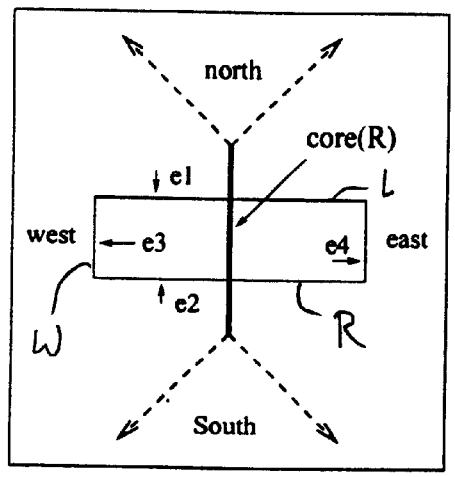
FIG. 13A illustrates a contact R with a core segment core(R) in accordance with the present invention.
Figure 13B:
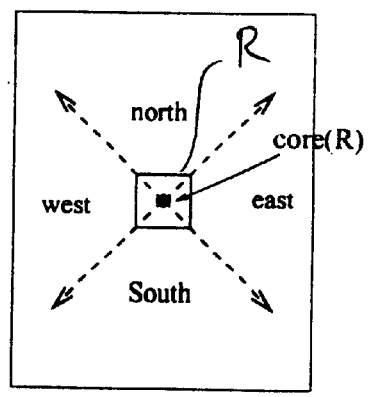
FIG. 13B illustrates a case where the contact R is a square and core(R) is a disjoint point in accordance with the present invention.

Referring to FIG. 13A, given a contact R (a rectangle), let l, w denote the length and the width of R ($l \geq w$). The radius of a square defect that totally covers R may be at least l/2, otherwise, it could not cover R no matter where it is placed. A defect of radius l/2 (i.e., a square of side l) is a minimal block for R. A block is any defect that totally covers a minimal block. Let the core of R, denoted core (R), be the locus of points where if a minimal block for R is centered the minimal block totally covers R. If R is a square (FIG. 13B), the minimal block is a square identical to R and core (R) is a single point, the center of R. Otherwise, as the following property 3 shows, core (R) is an orthogonal segment of opposite orientation from R (if R is horizontal (respectively vertical) core(R) is vertical (respectively horizontal). Let $e_i$, i=1,2,3,4 denote the north, south, west, and east edge of R respectively as shown in FIG. 13A.

Property 3: The core of a contact R (rectangle) is an orthogonal segment of opposite orientation from R that has length l−w and is centered at the same point as R.

Proof. Let's assume that R is a horizontal rectangle and let O denote the center of R. Any minimal block D has radius l/2 and must be centered along the vertical line L through O. Let $s_1$ (resp. $s_2$) be the topmost (resp. bottommost) point along L, where if D is centered it totally covers R. Clearly, $s_i$,i=1,2 must be l/2 away from O. Thus, segment $\overline{s_1s_2}$=l/2+l/2−w.

As in the case of breaks, core (R) is a generator of via-blocks for contact R. The segment s=core (R) is weighted by w(s)=l/2, the size of any minimal block for R. Let $e_i$,i=1,2,3,4 denote the north, south, west and east edge of R respectively (see FIG. 13A). Assume that R is horizontal i.e., s=core (R) is vertical, and let $s_1$,$s_2$ denote the north and south endpoints of s respectively. Note that $w(s)=d(s,e_3)=d(s,e_4)=d(s_1,e_2)=d(s_2,e_1)$. Consider the four 45° rays emanating from the endpoints of $s_1$,$s_2$ partitioning the plane into four quadrants. For any point t in the east (resp. west) quadrant the critical radius of t is determined by the horizontal distance of t from $e_3$ (resp. $e_4$) i.e., $r_c(t)=d(t,s)+w(s)$. For any point t in the north (resp. south) quadrant of s, the critical radius of t is the vertical distance from t to $e_2$ (resp. $e_1$) i.e., $r_c(t)=d(t,s)+w(s)$. Thus, in any case, $r_c(t)=d(t,s)+w(s)$, where s=core(R). The problem is now equivalent to breaks: Given G, the set of core elements for all contacts on a via layer, the weighted Voronoi diagram of G gives a partitioning of the plane into regions where the critical radius is easy to compute. For any point t in the Voronoi cell of core element s, the critical radius of t is $r_c(t)=d(t,s)+w(s)$. The computation of the total critical area can now be done equivalently to the critical area computation for breaks as described above.

Computing the Weighted Voronoi Diagram of Segments

The weighted $L_\infty$ Voronoi diagram of orthogonal segments is a simple skeleton combinatorially equivalent to the unweighted case. The weighted $L_\infty$ Voronoi diagram of orthogonal segments may include straight line segments in four orientations: vertical, horizontal and slope ±1, and has size O(n) where n is the number of segments.

Computing the weighted Voronoi diagram of orthogonal segments needs a minor modification to the plane sweep algorithm presented in application Ser. No. 09/156,069 for the (unweighted) Voronoi diagram of rectangles. The algorithm uses plane sweep by a vertical sweep-line and has time complexity O(n log n). The main difference here is the priority of a site event. A site event corresponds to the x-coordinate of a segment endpoint or the x-coordinate of a vertical segment (say, for example, $x_S$ (not shown)). In the unweighted case, the priority of a site event coincides with $x_s$. In the weighted case, the priority of a site event is $x_s+w(s)$ i.e., the weight of the event is added to the x–coordinate. In other words, a site event is not processed as soon as the sweep line reaches the event but it is processed later when the sweep line reaches position $x_s+w(s)$. When bisectors are computed the weights of the owners are added to the equations. Here the weights of core elements are not arbitrary and thus, $w(q) \leq w(p)+d(p,q)$, for any two core elements p,q. This implies that when a site event s is processed at time $x_s+w(s)$, s has not been covered by the wavefront yet. (See application Ser. No. 09/156,069 for the definition of the wavefront). If there exists a site s' such that $w(s')+d(s,s')=w(s)$ then the wavefront will touch s for the first time at $x_2+w(s)$. The reader is also referred to application Ser. No. 09/156,069 for the details of the algorithm. The time complexity is O (n log n) where n is the number of segments.

Computing the core of a shape P (simple or complex) corresponds to computing the $L_\infty$ Voronoi diagram (medial axis) in the interior of P. The plane sweep algorithm presented in application Ser. No. 09/156,069 is preferably used for this purpose.

Partial Missing Material Defects

Often missing material defects are caused by defects partially destroying a contact or a conducting path by altering its resistance. Thus, it is often desirable to compute critical area for partial breaks and partial blocks. Here partials are modeled geometrically in a manner that allows similar treatment.

A minimal α %-break is a defect D' derived from a minimal break D by shrinking r, the radius of D, by (1−α %)r. This is, D' is a square centered at the same point as D and has radius r'=α % r. An α %-break is any defect totally covering a minimal α %-break. By the definition, any minimal α %-break is centered along a core element s and has radius α % w(s). Thus, to determine the critical area for α %-breaks, the weight of core elements is set to α % of the original weight. Then, the critical area can be computed identically to ordinary breaks by computing the weighted Voronoi diagram of core elements using the reduced weights.

Partial blocks are defined similarly. Any α %-via-block D' is derived by shrinking an ordinary via-block D; the radius of D' is r'=α % r. Given a contact R of length l, an α %-block has radius α % l/2 and is centered at the same point as the corresponding ordinary block. Thus, the weight of s=core (R) is reduced to α % w (s) for α %-block. The critical area is computed in the same manner using the reduced weights.

Critical Area for Breaks in General Non-rectilinear Layouts

The method is generalizable to layouts with shapes in arbitrary orientations. This may be performed as described below. Let P be a shape (simple or complex) including edges that are not necessarily medial axis parallel and let M(P) denote the medial axis of P (i.e., the Voronoi diagram in the interior of P). The medial axis may be associated with a radius function R, which defines for each point on the axis its distance to the boundary of P. Given the $L_\infty$ medial axis and R, the shape can be reconstructed by taking the union of all squares centered on the points comprising the axis each with radius given by the radius function. Here, the radius function R is used as an additive weight function. In other words any point y along M(P) is weighted with w(y)=d(y,P). The square of radius w(y) (i.e., the square of side 2w(y)) centered at y is referred to as the minimal square induced by y. The minimal square at y corresponds to a minimal break if y is appropriately located on the medial axis. The core is defined for P so that it corresponds to the locus of centers of all minimal breaks of P. In other words, the core of P is defined so that it is the generator of all breaks for P. The core of P (denoted core(P)) is the set of all segments in M(P) that are not incident to the boundary of P.

Figure 14:
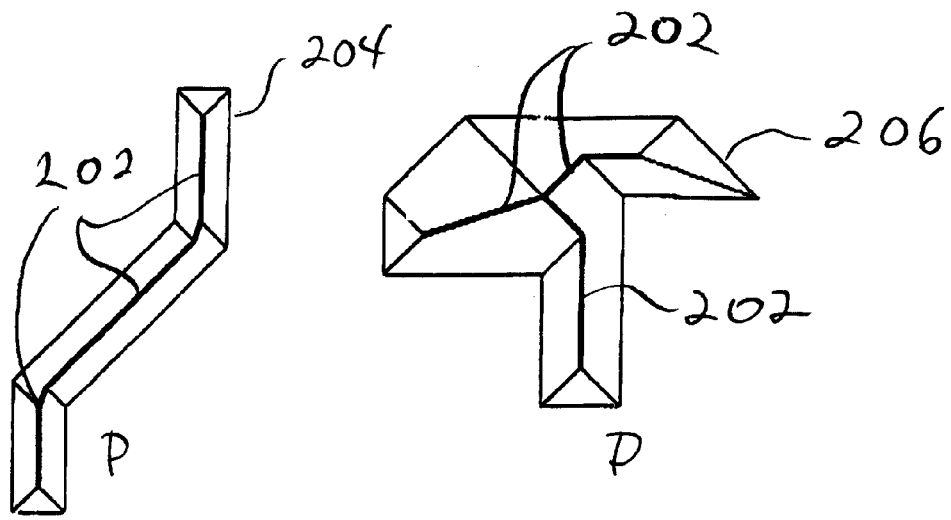
FIG. 14 illustrates non-rectilinear shapes for determination of critical area in accordance with the present invention.

In FIG. 14, the core is indicated as thickened lines 202 disposed within each shape P (e.g. shapes 204 and 206). This definition reasonably captures minimal breaks for shapes in VLSI designs: any defect overlapping only two adjacent edges of P is not considered to be a break. Here, a break is a defect overlapping a pair of edges in P represented in core(P) i.e., a pair of non-adjacent edges defining an edge in M(P). Note.that the definition of the core can be modified according to the needs of the application. For example, one may wish to include in the core a portion of a Voronoi edge that is incident to the boundary in case the minimal squares induced by the boundary are considered as breaks. Similarly, one can exclude segments from the core if the induced minimal squares should not be considered as breaks (e.g., correspond to non-conducting subshapes). Core elements are weighted with the corresponding radius function R. Note that in the rectilinear case the radius function for a core element was constant (horizontal or vertical line) while in the general case it is a linear function for segments other than horizontal or vertical segments. Note also that the rectilinear case excluded from the core all 45° medial axis segments. This was only done for simplicity of presentation. Equivalently, the core could have defined as above and have 45° core elements be weighted by their radius function. Because of the $L_\infty$ metric, the two definitions derive identical results. As in the rectilinear case, the (weighted) Voronoi diagram of the core elements of the given shapes needs to be computed. The difference is that weights are linear functions instead of constants. Let G denote the set of all core elements of shapes in one layer C ($G=\cup_P$ core(P), P∈C). The following property can be shown similarly to the rectilinear case.

Property 4: Given the weighted $L_\infty$ Voronoi diagram of G, the critical radius for breaks at any point t in the Voronoi cell of a core element s, s∈G, is $r_c(t)=d(t,s)+w(y)$ where y is the point on s realizing the $L_\infty$ distance of t from s i.e., d(t,s)=d(t,y).

Figure 15:
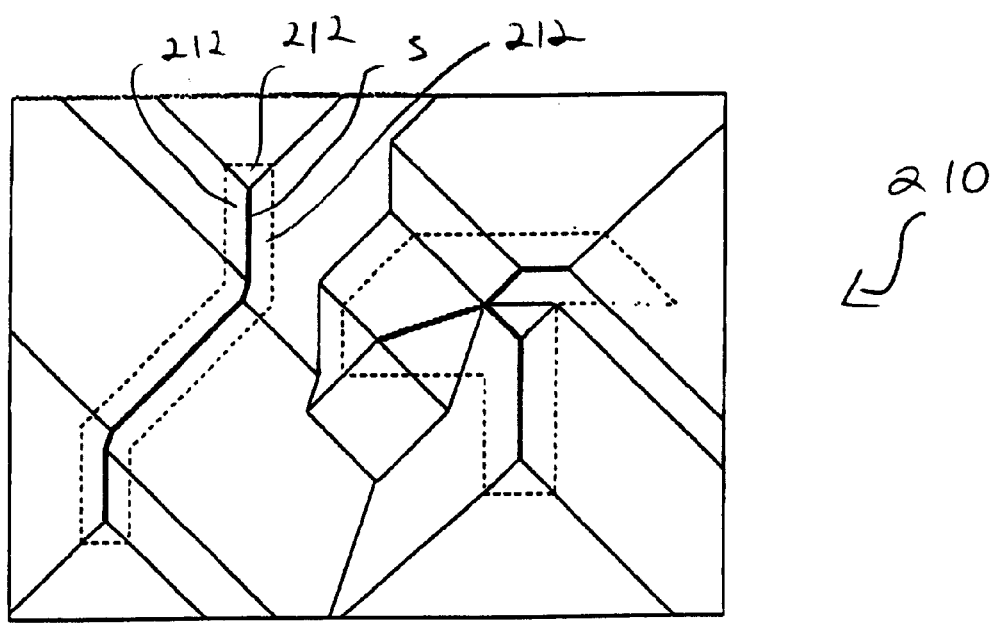
FIG. 15 illustrates a Voronoi diagram for core elements of non-rectilinear shapes for determination of critical area in accordance with the present invention.
Figure 1:
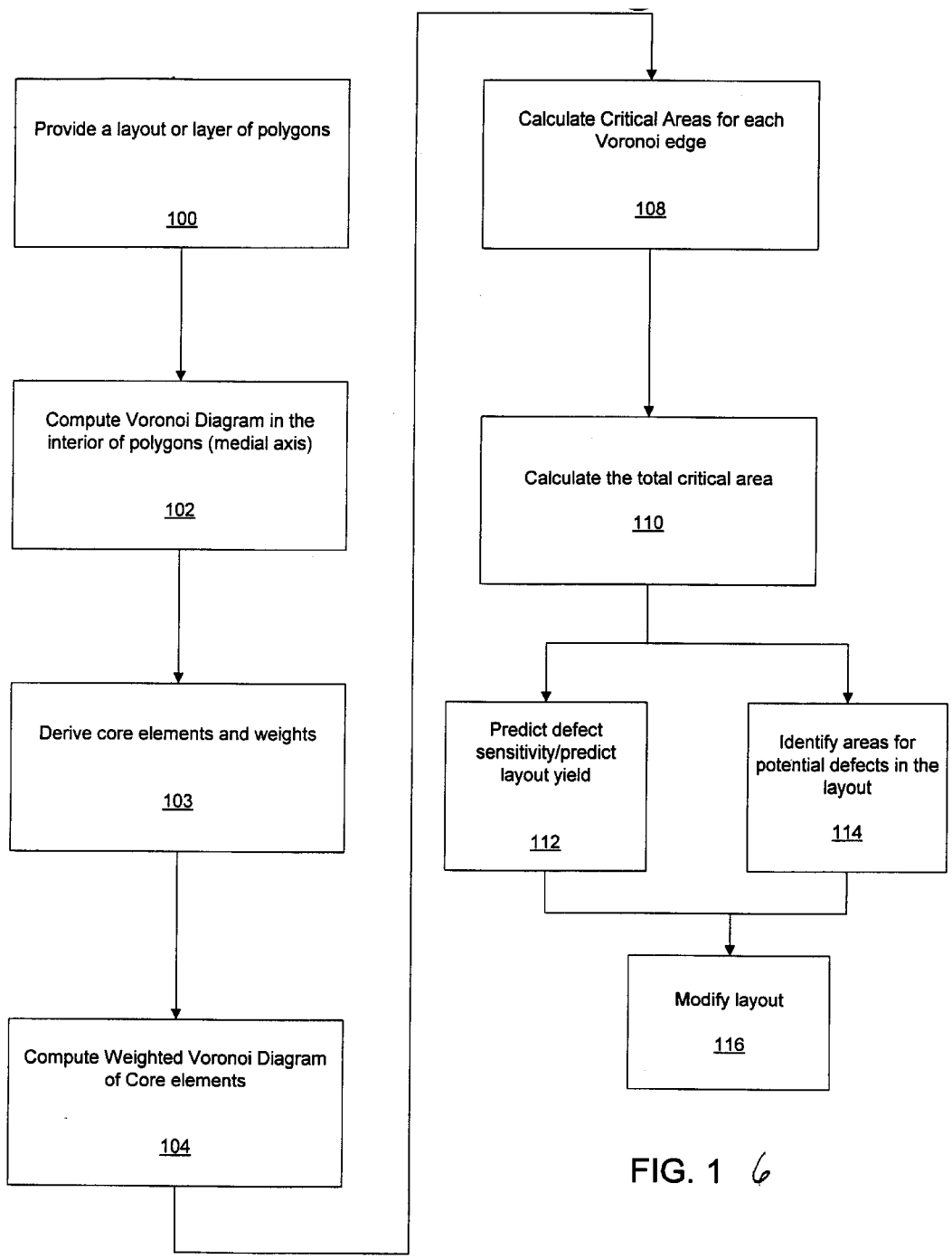

In general, the (weighted) bisector of two core elements s1, s2, denoted as b(s1,s2), is the bisector of the two elements of P defining s1 and s2 that are farthest apart. In more detail, lets assume that s1 (resp. s2) is oriented from left to right and that s1 (resp. s2) is defined by elements e1, e2 (resp e3, e4) to the left and to the right of s1 (resp. s2) respectively. Then b(s1,s2)=b(e1,e4). Because of this observation, computing v(G) can be done by a modification of the method described in application Ser. No. 09/156,069. The main modification is the same as in the rectilinear case i.e., modify the priority of a site event by adding the weight of the first endpoint encountered by the scanline. The bisector between any two core elements is computed as explained above. Referring to FIG. 15, a weighted Voronoi diagram 210 of core elements is shown. The endpoints of the core that are incident to only one core element have their own Voronoi regions. The Voronoi cell of a core element s is subdivided into subcells 212, each one is associated with one of the defining polygonal elements and the endpoints(s) of s. Each subcell has a unique owner who is responsible for breaks within this subcell.

Once the (weighted) Voronoi diagram v(G)$ is computed the critical area integral can be discretized as a summation of Voronoi edges similarly to critical area computed in application Ser. No. 09/156,069 for non-rectilinear layouts. The core elements are considered to be part of the Voronoi diagram. Voronoi edges are colored red, blue, and neutral using the same criteria as in application Ser. No. 09/156,069. All core elements are colored red. Red edges have positive contribution to critical area, blue edges have negative contribution and neutral edges have no contribution. The formula employed for calculating critical area is similar to the rectilinear case except for the slopes of non-axis parallel edges.

The present invention includes geometric modeling of critical area for missing material defects via Voronoi diagrams. The modeling includes breaks and via-blocks and can also be extended to partial defects. The reduction to Voronoi diagrams resulting in an O (n log n) algorithm to compute the total critical area for all possible defect sizes following the $r^2_0/r^3$ defect size distribution. The computation is carried out in the $L_\infty$ metric which corresponds to treating defects of size r as squares of radius r. Note that the core elements of a shape provide instant information about the pairs of edges forming thin subshapes that are most vulnerable to breaks. In the present invention, the rectilinear case is illustratively presented for simplicity. However, the invention is generalizable to non-rectilinear layouts. The present invention provides geometric modeling of layers for semiconductor devices to compute critical areas for missing material defects.

It should be understood that the elements shown in FIG. 16 may be implemented in various forms of hardware, software or combinations thereof. Preferably, these elements are implemented in software on one or more appropriately programmed general purpose digital computers having a processor and memory and input/output interfaces. Referring to FIG. 14, a block/flow diagram illustrates a system and method for calculating critical area for breaks/blocks in accordance with the present invention. In block 100, a layout of shapes is supplied to the system. These shapes may include components, nets, circuits, etc. in a plane or a layer, such as a contact or other metallization layer. These shapes are preferably digitally rendered. In block 102, a Voronoi diagram (for medial axis determination) in the interior of shapes is computed and generated as described above. Then, in block 103, core elements and their weights are extracted from the medial axis information determined in block 102. In block 104, a weighted Voronoi diagram is computed and generated as described above. A plane (layer) is partitioned into regions called Voronoi cells. The boundary that borders two Voronoi cells is a Voronoi edge.

A Voronoi edge has two owners, as defined above. Every edge in the Voronoi diagram of a layout is colored red or blue or neutral with respect to each one of its owners. An edge may be colored red with respect to one owner and blue with respect to the other owner. In this case the contribution of the edge gets canceled (i.e., addition of red critical area and the subtraction of the blue critical area). Thus, there is no need to consider such edge and it is deemed neutral, i.e., it is ignored. A Voronoi edge is colored red or blue with respect to its owner as described above.

The critical area is computed by adding up critical area within each Voronoi cell in block 108. In each Voronoi cell, the critical area is derived as a function of the Voronoi edges bounding that cell. Let e denote the owner of the cell. For each red Voronoi edge e, add to the total critical area. For each blue Voronoi edge (or boundary) e, subtract from the total critical area. Also, neutral edges do not add or subtract to the critical area. A total critical area is determined by summing the critical areas of the layout in block 110 as described. Other formulas are contemplated for area computations in accordance with the invention as well.

It is to be understood that the steps in blocks 102, 104, 108 and 110 may be computed simultaneously during a plane sweep. In other words, there is no need to first compute the whole Voronoi diagram, then compute the weighted Voronoi diagram and then compute the critical area. Instead, as the plane sweep proceeds, as soon as a Voronoi cell is computed, the weighted Voronoi diagram may be computed, and the critical area derived for that portion of the cell contributing to the total critical area. Plane sweeps are described in application Ser. No. 09/156,069. Defect sensitivity and layout yield are predicted in block 112 and the layout may be accepted or rejected based on this. Design changes for the layout may be based on these predictions as well.

It has been shown how to compute and use the Voronoi diagram of polygons to efficiently compute critical area for opens (breaks or blocks) in a single layer for planar circuits or a level of a circuit for an integrated circuit. The value of critical area can then be used in evaluating yield (block 112). Furthermore, the Voronoi diagram is used to identify the places in the layout that are most vulnerable to spot defects in block 114. Note that Voronoi edges provide immediate information about the partial critical area caused by the corresponding pair of layout edges. In other words, information about those layout edges that contribute most to critical area may be readily obtained. By slightly perturbing such edges the present invention is able to reduce the value of critical area and thus increase yield. Note that after moving an edge the Voronoi diagram can be updated dynamically in time proportional to the changes caused to the diagram because of the move. Thus, the Voronoi diagram approach is suitable for an interactive critical area tool. Note also that a topographic map essentially provides a bitmapped version of the more critical Voronoi edges. This provides information needed to improve the layout to increase yield. In block 116, the layout is modified in accordance with the critical area computation. The Voronoi diagram approach can also be extended to layouts with shapes in arbitrary orientations as described. The Voronoi diagram approach may further be employed as a diagnostic tool to automatically search for failures in a design.

Having described preferred embodiments of a method and system for determining critical area for circuit layouts (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for computing critical area for opens of a layout, comprising the steps of:

computing Voronoi diagrams of shapes of the layout;

determining core elements and weights for the core elements of the shapes;

computing a weighted Voronoi diagram for the layout to arrive at a partitioning of the layout into regions;

computing critical area within each region;

summing the critical areas to arrive at a total critical area for opens in the layout; and identifying areas in the layout sensitive to opens based on the critical areas.

2. The method as recited in claim 1, wherein the step of computing critical area includes the step of computing the critical area according to the following equation:

$$A_c = \int_0^\infty A(r)D(r)\,dr,$$

where $A_c$ is the critical area, $A(r)$ is the area of the critical region for defects of radius r and $D(r)$ is a defect density function.

3. The method as recited in claim 2, wherein the defect density function includes the defect size distribution $D(r) = r_0^2/r^3$ where r denotes spot defect radius and $r_0$ denotes a constant size.

4. The method as recited in claim 1, wherein the Voronoi diagram includes Voronoi edges associated with shapes of the layout and the method further comprises the step of classifying the Voronoi edges to identify between edges that contribute to the critical area and edges that subtract from the critical area.

5. The method as recited in claim 4, wherein the shapes include locations for circuit components.

6. The method as recited in claim 1, wherein the Voronoi diagram and the weighted Voronoi diagram include an $L_\infty$ distance metric.

7. The method as recited in claim 1, wherein the step of computing the Voronoi diagram includes the step of computing the Voronoi diagram using a sweep line algorithm.

8. The method as recited in claim 1, wherein the step of weighting the Voronoi diagram includes the step of computing the Voronoi diagram using a sweep line algorithm.

9. The method as recited in claim 1, further comprises the step of adjusting the shapes of the layout according to the critical area.

10. The method as recited in claim 1, further comprises the step of computing areas for regions of the layout associated with shapes having edges running horizontally and vertically.

11. The method as recited in claim 1, further comprises the step of adapting computations of areas for the regions of the layout associated with shapes in the layout having edges with any slope.

12. The method as recited in claim 1, wherein the step of summing the critical areas includes the steps of:

adding amounts derived from Voronoi edges that contribute to the total critical areas; and subtracting amounts derived from Voronoi edges that reduce the total critical area.

13. The method as recited in claim 1, wherein the opens include one of breaks and blocks.

14. The method as recited in claim 1, wherein the opens include partial opens and the method further comprising the step of providing a partial critical area for computing the critical area of a partial open by multiplying neighboring core elements by a fraction to represent a critical radius of the partial open.

15. A method for predicting yield based on critical area for opens of a layout of a circuit, comprising the steps of:

computing a Voronoi diagram based on core elements of the layout;

computing a weighted Voronoi diagram for segments of the core elements to arrive at a partitioning of the layout into regions;

computing critical area within each region;

summing the critical areas to arrive at a total critical area for opens in the layout;

predicting a sensitivity to defects of the layout based on the total critical area; and modifying the layout according to the sensitivity.

16. The method as recited in claim 15, wherein the step of computing critical area includes the step of computing the critical area according to the following equation:

$$A_c = \int_0^\infty A(r)D(r)\,dr,$$

where $A_c$ is the critical area, $A(r)$ is the area of the critical region for defects of radius r and $D(r)$ is a defect density function.

17. The method as recited in claim 16, wherein the defect density function includes the defect size distribution $D(r) = r_0^2/r^3$ where r denotes spot defect radius and $r_0$ denotes a constant size.

18. The method as recited in claim 15, wherein the Voronoi diagram includes Voronoi edges associated with shapes of the layout and the method further comprises the step of classifying the Voronoi edges to identify between edges that contribute to the critical area and edges that subtract from the critical area.

19. The method as recited in claim 18, wherein the shapes include locations for circuit components.

20. The method as recited in claim 15, wherein the Voronoi diagram and the weighted Voronoi diagram include an $L_\infty$ distance metric.

21. The method as recited in claim 15, wherein the step of computing the Voronoi diagram includes the step of computing the Voronoi diagram using a sweep line algorithm.

22. The method as recited in claim 15, wherein the step of computing a weighted Voronoi diagram includes the step of computing the weighted Voronoi diagram using a sweep line algorithm.

23. The method as recited in claim 15, further comprises the step of computing areas for regions of the layout associated with shapes having edges running horizontally and vertically.

24. The method as recited in claim 15, further comprises the step of adapting computations of areas for the regions of the layout associated with shapes in the layout having edges with any slope.

25. The method as recited in claim 15, wherein the step of summing the critical areas includes the steps of:

adding amounts derived from Voronoi edges that contribute to the total critical areas; and subtracting amounts derived from Voronoi edges that reduce the total critical area.

26. The method as recited in claim 15, wherein the opens include one of breaks and blocks.

27. The method as recited in claim 15, wherein the opens include partial opens and the method further comprising the step of providing a partial critical area for computing the critical area of a partial open by multiplying neighboring core elements by a fraction to represent a critical radius of the partial open.

28. A program storage device readable by machine, tangibly embodying a program of instructions executable by the machine to perform method steps for computing critical area for opens of a layout, the method steps comprising:

computing Voronoi diagrams of shapes of the layout;

determining core elements and weights for the core elements of the shapes;

computing a weighted Voronoi diagram for the layout to arrive at a partitioning of the layout into regions;

computing critical area within each region; and summing the critical areas to arrive at a total critical area for opens in the layout.

29. The program storage device as recited in claim 28, wherein the step of computing critical area includes the step of computing the critical area according to the following equation:

$$A_c = \int_0^\infty A(r)D(r)\,dr,$$

where $A_c$ is the critical area, $A(r)$ is the area of the critical region for defects of radius r and $D(r)$ is a defect density function.

30. The program storage device as recited in claim 29, wherein the defect density function includes the defect size distribution $D(r)=r_0^2/r^3$ where r denotes spot defect radius and ro denotes a constant size.

31. The program storage device as recited in claim 28, wherein the Voronoi diagram includes Voronoi edges associated with shapes of the layout and the method steps further comprising the step of classifying the Voronoi edges to identify between edges that contribute to the critical area and edges that subtract from the critical area.

32. The program storage device as recited in claim 31, wherein the shapes include locations for circuit components.

33. The program storage device as recited in claim 28, wherein the Voronoi diagram and the weighted Voronoi diagram include an $L_\infty$ distance metric.

34. The program storage device as recited in claim 28, wherein the step of computing the Voronoi diagram includes the step of computing the Voronoi diagram using a sweep line algorithm.

35. The program storage device as recited in claim 28, wherein the step of weighting the Voronoi diagram includes the step of computing the Voronoi diagram using a sweep line algorithm.

36. The program storage device as recited in claim 28, wherein the method steps further comprising the step of adapting computations of areas for the regions of the layout associated with shapes in the layout having edges with any slope.

37. The program storage device as recited in claim 28, wherein the step of summing the critical areas includes the steps of:

adding amounts derived from Voronoi edges that contribute to the total critical areas; and subtracting amounts derived from Voronoi edges that reduce the total critical area.

38. The program storage device as recited in claim 28, wherein the opens include one of breaks and blocks.

39. The program storage device as recited in claim 28, wherein the opens include partial opens and wherein the method steps further comprise the step of providing a partial critical area for computing the critical area of a partial open by multiplying neighboring core elements by a fraction to represent a critical radius of the partial open.

\* \* \* \* \*